(12) United States Patent
Mouli

(10) Patent No.: US 8,481,372 B2
(45) Date of Patent: Jul. 9, 2013

(54) JFET DEVICE STRUCTURES AND METHODS FOR FABRICATING THE SAME

(75) Inventor: Chandra Mouli, Boise, ID (US)

(73) Assignee: Micron Technology, Inc., Boise, ID (US)

(*) Notice: Subject to any disclaimer, the term of this patent is extended or adjusted under 35 U.S.C. 154(b) by 615 days.

(21) Appl. No.: 12/333,012

(22) Filed: Dec. 11, 2008

(65) Prior Publication Data

US 2010/0148226 A1 Jun. 17, 2010

(51) Int. Cl.
*H01L 21/337* (2006.01)

(52) U.S. Cl.
USPC ........... 438/136; 257/256; 257/287; 257/272; 257/278; 257/274; 257/E21.274; 438/135; 438/142; 438/186; 438/188; 438/423; 438/778; 438/783

(58) Field of Classification Search
None
See application file for complete search history.

(56) References Cited

U.S. PATENT DOCUMENTS

| | | | |
|---|---|---|---|
| 3,919,765 A | 11/1975 | Schloetterer | |
| 4,143,392 A * | 3/1979 | Mylroie | 257/273 |
| 4,612,629 A | 9/1986 | Harari | |
| 4,679,298 A | 7/1987 | Zuleeg et al. | |
| 5,243,209 A | 9/1993 | Ishii | |
| 5,321,283 A | 6/1994 | Cogan et al. | |
| 5,357,127 A | 10/1994 | Park et al. | |
| 5,378,642 A | 1/1995 | Brown et al. | |
| 5,393,998 A | 2/1995 | Ishii et al. | |
| 5,614,433 A * | 3/1997 | Mandelman | 438/154 |
| 5,668,397 A | 9/1997 | Davis et al. | |
| 6,174,763 B1 | 1/2001 | Beilstein et al. | |
| 6,249,484 B1 | 6/2001 | Pawlowski | |
| 6,271,550 B1 | 8/2001 | Gehrmann | |
| 6,310,378 B1 | 10/2001 | Letavic et al. | |
| 6,313,489 B1 | 11/2001 | Letavic et al. | |
| 6,404,015 B2 | 6/2002 | Emmerik et al. | |
| 6,503,782 B2 | 1/2003 | Casady et al. | |
| 6,624,476 B1 * | 9/2003 | Chan et al. | 257/347 |
| 6,767,783 B2 | 7/2004 | Casady et al. | |
| 6,936,866 B2 | 8/2005 | Deboy et al. | |
| 7,049,196 B2 | 5/2006 | Noble | |
| 7,122,411 B2 | 10/2006 | Mouli | |
| 7,199,442 B2 | 4/2007 | Shenoy | |

(Continued)

FOREIGN PATENT DOCUMENTS

| | | |
|---|---|---|
| JP | 5129559 | 5/1993 |
| WO | WO8808617 | 11/1988 |

OTHER PUBLICATIONS

Wolf, Stanley. Silicon Processing for the VLSI Era vol. 4—Deep-Submicron Process Technology. USA: Lattice Press, 2002.*

(Continued)

*Primary Examiner* — Fei Fei Yeung Lopez
(74) *Attorney, Agent, or Firm* — Fletcher Yoder

(57) ABSTRACT

In accordance with the present techniques, there is provided a JFET device structures and methods for fabricating the same. Specifically, there is provided a transistor including a semiconductor substrate having a source and a drain. The transistor also includes a doped channel formed in the semiconductor substrate between the source and the drain, the channel configured to pass current between the source and the drain. Additionally, the transistor has a gate comprising a semiconductor material formed over the channel and dielectric spacers on each side of the gate. The source and the drain are spatially separated from the gate so that the gate is not over the drain and source.

10 Claims, 7 Drawing Sheets

U.S. PATENT DOCUMENTS

| | | | |
|---|---|---|---|
| 7,202,528 | B2 | 4/2007 | Sankin et al. |
| 7,288,821 | B2 | 10/2007 | Kwon |
| 7,294,860 | B2 | 11/2007 | Mazzola et al. |
| 2002/0024075 | A1* | 2/2002 | Kumagai et al. ............. 257/296 |
| 2002/0096719 | A1* | 7/2002 | Dockerty et al. ............. 257/347 |
| 2003/0197547 | A1* | 10/2003 | Mizuno et al. ................ 327/534 |
| 2004/0065884 | A1* | 4/2004 | Bhattacharyya ................ 257/67 |
| 2004/0175926 | A1* | 9/2004 | Wang et al. ................... 438/627 |
| 2004/0209429 | A1* | 10/2004 | Lin et al. ....................... 438/279 |
| 2005/0110159 | A1* | 5/2005 | Oh et al. ........................ 257/777 |
| 2005/0285157 | A1* | 12/2005 | Hower et al. ................. 257/287 |
| 2006/0046355 | A1 | 3/2006 | Parekh et al. |
| 2006/0094216 | A1* | 5/2006 | Nam .............................. 438/595 |
| 2006/0197129 | A1 | 9/2006 | Wohlmuth |
| 2007/0023794 | A1* | 2/2007 | Kang et al. .................... 257/288 |
| 2007/0096144 | A1 | 5/2007 | Kapoor et al. |
| 2008/0001183 | A1 | 1/2008 | Kapoor |
| 2008/0272395 | A1* | 11/2008 | Banna ............................ 257/190 |
| 2008/0272406 | A1* | 11/2008 | Banna ............................ 257/270 |

OTHER PUBLICATIONS

Wolf, Stanley. Silicon Processing for the VLSI Era vol. 3—The Submicron MOSFET. USA: Lattice Press, 1995.*

Wolf et al. Silicon Processing for the VLSI Era vol. 1—Process Technology, second edition. USA: Lattice Press, 2000.*

Wolf, Stanley, Silicon Processing for the VLSI Era vol. 2—Process Integration. USA: Lattice Press, 1990.*

U.S. Appl. No. 12/179,330, filed Jul. 24, 2008; Applicant: Chandra Mouli; Entitled: JFET Devices with PIN Gate Stacks and Methods of Making Same.

U.S. Appl. No. 12/333,012, filed Dec. 11, 2008; Applicant: Chandra Mouli; Entitled: JFET Device Structures and Methods for Fabricating the Same.

U.S. Appl. No. 12/333,067, filed Dec. 11, 2008; Applicant: Chandra Mouli; Entitled: Low Power Memory Device with JFET Device Structures.

Dungan, T.E. et al.; One-Transistor GaAs MESFET and JFET Accessed Dynamic RAM Cells for High-Speed Medium Density Applications; IEEE Transportation on Electronic Devices; Jul. 1990, vol. 37, pp. 1599-1607.

Waldrop, J.R.; Schottky Barrier Height of Metal Contacts to P-Type Alpha 6H-SiC; J. Appl. Phys. 75 (9) 1994.

Mitleher et al.; Switching Behaviour of Fast High Voltage SiC pn-Diodes; Proceedings of 1998 International Symposium on Power Semiconductor Devices and ICs, Kyoto, pp. 127-130.

Round, S. et al.; A SiC JFET Driver for A 5 Kw, 150 KhZ Three-Phase PWM Converter; IEEE Conference, Pub. Oct. 2-6, 2005, pp. 410-416.

Funaki, T. et al.; Characterization of SiC JFET for Temperature Dependent Device Modeling; IEEE Conference, Pub. Jun. 18-22, 2006, pp. 1-6.

* cited by examiner

JFET DEVICE STRUCTURES AND METHODS FOR FABRICATING THE SAME

BACKGROUND

1. Field of the Invention

Embodiments of the present invention relate generally to the field of semiconductor devices. More particularly, embodiments of the present invention relate to improved semiconductor devices and techniques for fabricating improved semiconductor devices.

2. Description of the Related Art

Currently, the most commonly used transistor for implementing logic devices in integrated circuits is the metal-oxide semiconductor field effect transistor (MOSFET). The combination of complementary n-type and p-type MOSFETs, a technology known as "CMOS," allows for the creation of logic devices, such as AND gates, NOR gates, NAND gates and OR gates, for example. In CMOS, n-MOS and p-MOS devices are connected in series and no drain current flows— except for a small charging current during the switching process between two different states. MOSFET sizes have been reduced through improved fabrication techniques generally referred to as "scaling," which has led to smaller, faster and more dense circuits.

More recently, however, the speed benefits typically associated with scaling have diminished due to fundamental physical constraints inherent in MOSFETs. For example, in order to switch the voltage state of a MOSFET, the MOSFET's gate terminal must be sufficiently charged. The amount of charge that will switch the MOSFET on is proportional to the capacitance of the MOSFET's gate terminal. One consequence of scaling is that the thickness of the gate insulator is reduced to maintain acceptably small short-channel effects. Furthermore, to counteract the increased leakage current that may result from the reduced dielectric thickness and thereby keep the gate leakage current below acceptable levels, the gate insulator may be made of a dielectric with a dielectric constant, "k," higher than that of silicon dioxide (k of 3.9). Both the reduced thickness and the higher dielectric constant result in higher capacitance. Therefore, although the maximum drain current may increase for the scaled CMOS device, this benefit is largely limited by the increased capacitance. The result is that, although the density of CMOS devices continues to increase, the speed performance of such devices has not increased substantially over the generations.

Junction field effect transistors (JFETs), on the other hand, do not utilize an insulated gate. Rather, in a typical JFET, the gate is a p-doped or n-doped semiconductor material and the gate directly contacts the semiconductor body, forming a p-n junction between the gate and the transistor's conductive channel. Because JFETs do not utilize an insulated gate, the total gate capacitance in a JFET may be greatly reduced, which may result in a higher transistor switching speed compared to existing CMOS technology.

However, conventional JFETs have limited applicability due to the low forward-bias turn-on voltage, i.e. the diode turn-on voltage, of the p-n junction between the gate and the channel of the JFET. In a typical JFET, the depletion region at the gate-channel interface prevents conduction when the gate potential is sufficiently low. To turn on the JFET, the gate potential is raised, which narrows the depletion region, allowing current to flow between the source and the drain. When the gate potential is raised above the forward bias potential of the p-n junction between the gate and the channel (typically 0.6 to 0.7 volts), current then starts to flow from the gate to the drain, increasing the power consumption of the device. There is a limit, therefore, to the voltage that may be applied to a JFET. As a result, conventional JFETs may not be suitable in systems or devices which utilize a high voltage relative to the diode turn-on voltage of the JFET.

Therefore, it may be advantageous to provide an improved low-power semiconductor device with reduced gate capacitance and faster switching speed compared to existing CMOS technology. Specifically, it may be advantageous to provide a JFET with improved electrical characteristics that address the limitations discussed above.

DETAILED DESCRIPTION

Embodiments of the present invention relate to JFETs with improved electrical characteristics that address the limitations discussed above, making them more suitable for use in a wide range of semiconductor devices, such as logic devices and memory access devices. Specifically, several embodiments relate to methods and devices for raising the voltage level that may be applied to the gate of a JFET without exceeding the diode turn-on voltage of the p-n junction between the gate and the channel. Several embodiments also relate to systems and devices that include JFETs with improved electrical characteristics.

For the sake of clarity, it is noted that in discussing the relationship between deposited materials, the terms "over," or "above" are used to describe materials that are connected but that may, or may not, be in direct contact. By contrast, the term "directly on" is used to indicate direct contact between the materials described.

Figure 1:
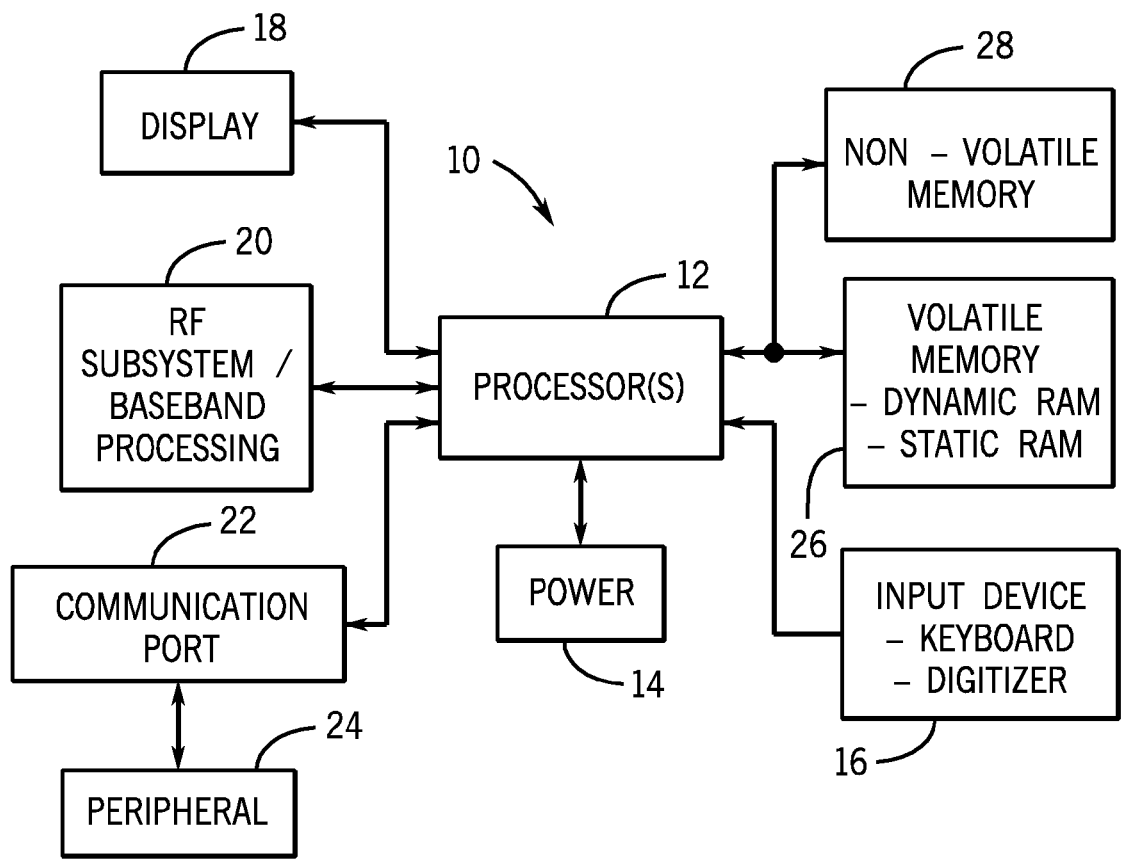
FIG. 1 illustrates a block diagram of a processor-based device in accordance with embodiments of the present invention.

Turning now to the drawings, and referring initially to FIG. 1, a block diagram depicting a processor-based system, generally designated by reference numeral 10, is illustrated. The system 10 may be any of a variety of electronic devices such as a computer, pager, cellular phone, personal organizer, control circuit, etc. In a typical processor-based device, a processor 12, which may include one or more processors, controls the processing of system functions and requests in the system 10. As will be appreciated, the processor 12 may include an embedded North or South bridge (not shown), for coupling components thereto. Alternatively, the bridges may be separate from the processor 12 and coupled between the processor 12 and the various components of the system 10.

The system 10 typically includes a power supply 14. For instance, if the system 10 is a portable system, the power supply 14 may advantageously include permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance. Various other devices may be coupled to the processor 12 depending on the functions that the system 10 performs. For instance, a user interface 16 may be coupled to the processor 12. The user interface 16 may include buttons, switches, a keyboard, a light pen, a mouse, and/or a voice recognition system, for instance. A display 18 may also be coupled to the processor 12. The display 18 may include an LCD display, a CRT, LEDs, and/or an audio display, for example. Furthermore, an RF sub-system/baseband processor 20 may also be coupled to the processor 12. The RF sub-system/baseband processor 20 may include an antenna that is coupled to an RF receiver and to an RF transmitter (not shown). One or more communication ports 22 may also be coupled to the processor 12. The communication port 22 may be adapted to be coupled to one or more peripheral devices 24 such as a modem, a printer, a computer, or to a network, such as a local area network, remote area network, intranet, or the Internet, for instance.

Because the processor 12 generally controls the functioning of the system 10 by implementing software programs, memory is operably coupled to the processor 12 to store and facilitate execution of various programs. For instance, the processor 12 may be coupled to the volatile memory 26 which may include Dynamic Random Access Memory (DRAM) and/or Static Random Access Memory (SRAM). The volatile memory 26 may include a number of memory modules, such as single inline memory modules (SIMMs) or dual inline memory modules (DIMMs). As can be appreciated, the volatile memory 26 may simply be referred to as the "system memory." The volatile memory 26 is typically quite large so that it can store dynamically loaded applications and data.

The processor 12 may also be coupled to non-volatile memory 28. The non-volatile memory 28 may include a read-only memory (ROM), such as an EPROM, and/or flash memory to be used in conjunction with the volatile memory. The size of the ROM is typically selected to be just large enough to store any necessary operating system, application programs, and fixed data. Additionally, the non-volatile memory 28 may include a high capacity memory such as a tape or disk drive memory.

Figure 2:
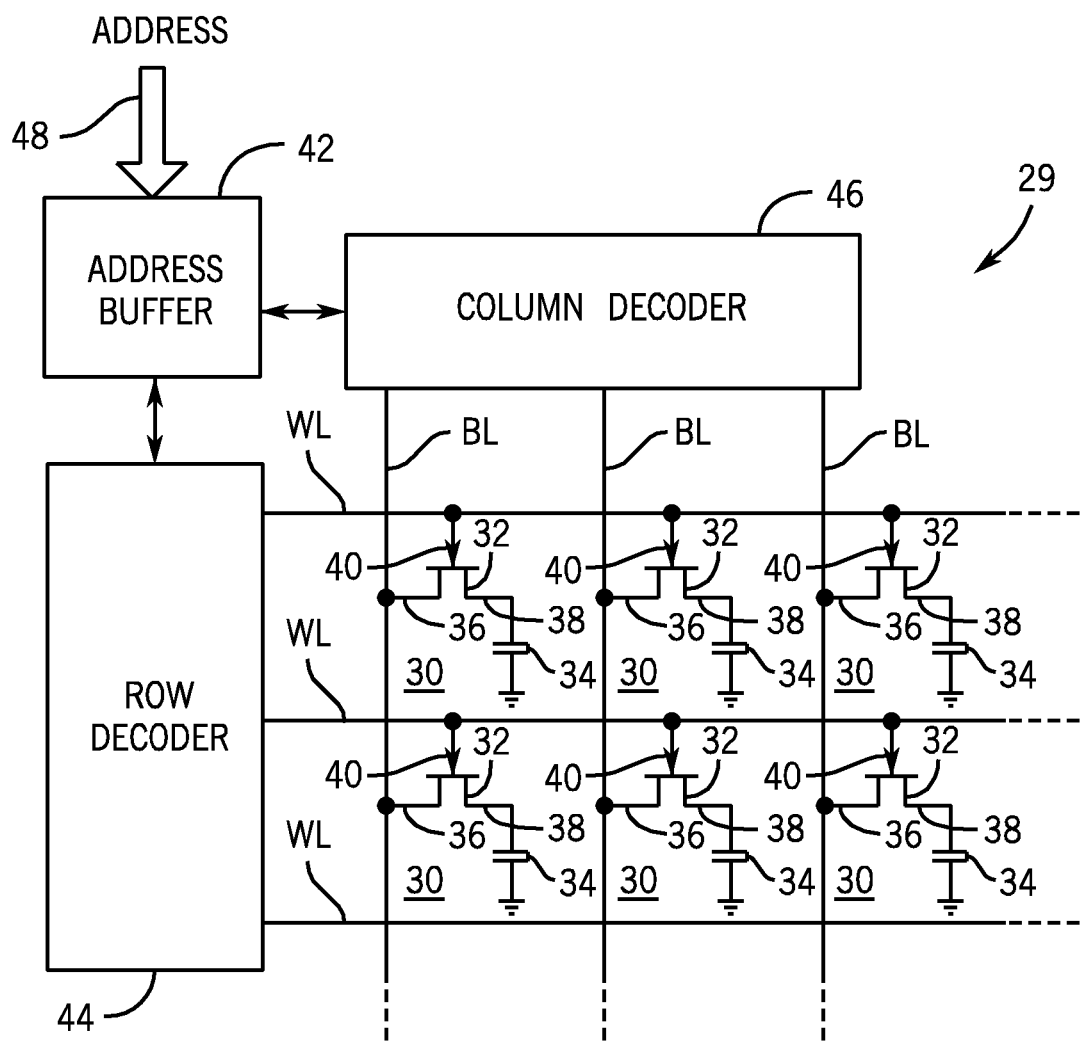
FIG. 2 illustrates a partial schematic illustration of an integrated circuit, incorporating an array of memory cells in accordance with embodiments of the present invention.
Figure 3:
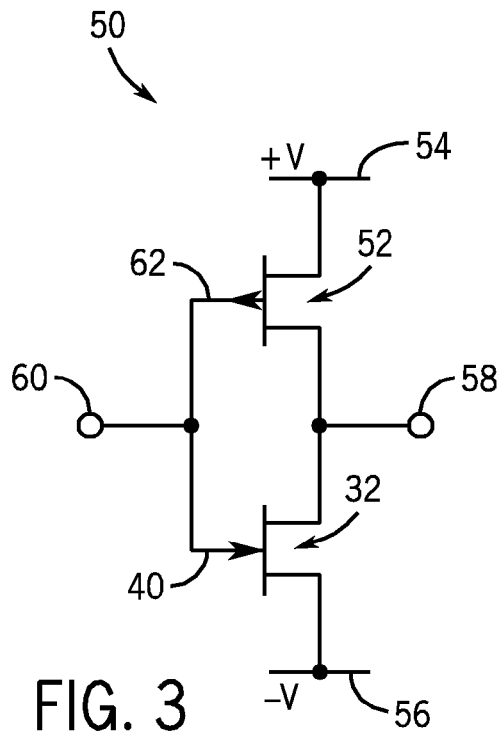
FIGS. 3-5 are circuit schematics of logic devices, incorporating complementary PIN-gate JFETs in accordance with embodiments of the present invention.
Figure 4:
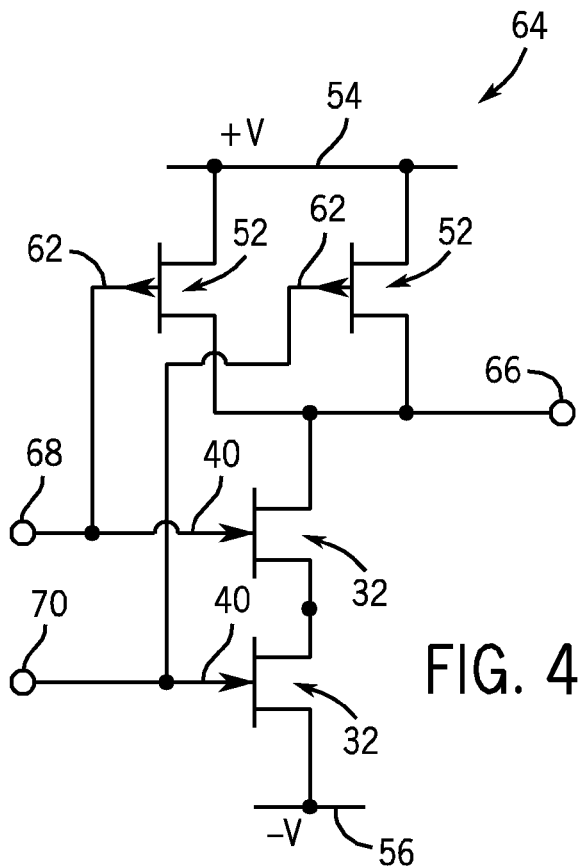
Figure 5:
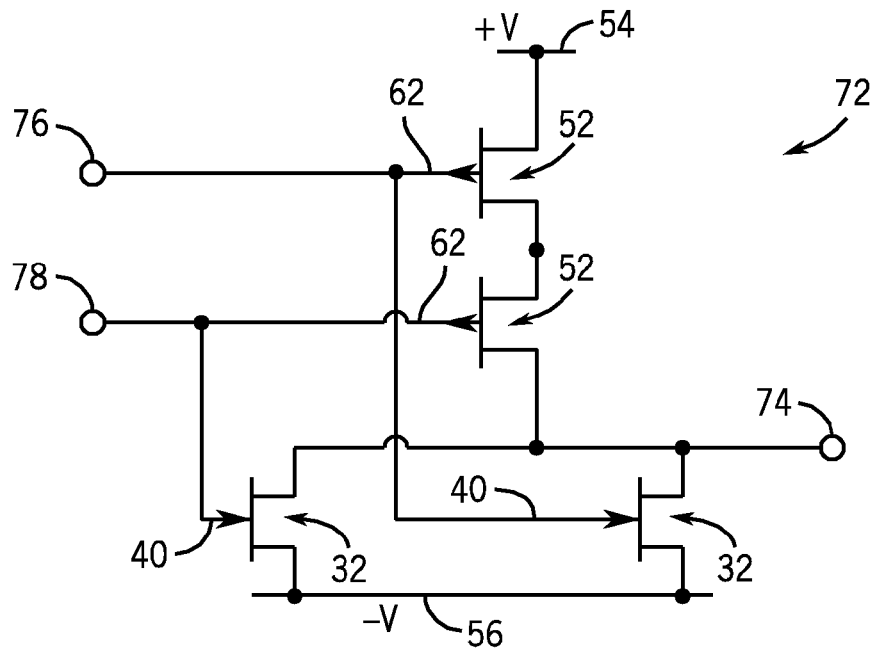

One or more components of the system 10 may include improved JFETs (depicted herein with reference numeral "32" for n-type and "52" for p-type) fabricated in accordance with embodiments described herein. Some examples of devices in which improved JFETs may be beneficial are illustrated in FIGS. 2-5. Specifically, FIG. 2 illustrates a memory device with improved JFETs, and FIGS. 3-5 illustrate integrated circuit logic devices with improved JFETs. Additionally, FIGS. 6-13 describe the improved JFETs and methods of fabrication.

Referring now to FIG. 2, a partial schematic illustration of an integrated circuit, such as a memory device 29, which may be implemented in the volatile memory 26, is illustrated. The memory device 29 includes an array of memory cells having transistors which may be fabricated in accordance with the techniques described herein. In one or more embodiments, the memory device 29 may comprise a dynamic random access memory (DRAM) device. The memory device 29 includes a number of memory cells 30 arranged in a grid pattern and comprising a number of rows and columns. The number of memory cells 30 (and corresponding rows and columns) may vary depending on system requirements and fabrication technology. Each memory cell 30 includes an access device comprising a JFET 32 and a storage device comprising a capacitor 34. The access device is implemented to provide controlled access to the storage device. The JFET 32 includes a drain terminal 36, a source terminal 38, and a gate 40. The capacitor 34 is coupled to the source terminal 38. The terminal of the capacitor 34 that is not coupled to the JFET 32 may be coupled to a ground plane. As described further below, the drain 36 is coupled to a bit line (BL) and the gate 40 is coupled to a word line (WL).

It should be noted that although the above description depicts the terminal of the access device coupled to the capacitor 34 as the "source" 38 and the other non-gate terminal of the access device as the "drain" 36, during read and write operations, the JFET 32 may be operated such that each of the terminals 36 and 38 operates at one time or another as a source or a drain. Accordingly, for purposes of further discussion it should be recognized that whenever a terminal is identified as a "source" or a "drain," it is only for convenience and that in fact during operation of the JFET 32 either terminal could be a source or a drain depending on the manner in which the JFET 32 is being controlled by the voltages applied to the terminals 36, 38 and 40. In addition, it will be appreciated that embodiments of a memory device 29 may include p-type JFETs, n-type JFETS or a combination of both.

As previously described, the memory array is arranged in a series of rows and columns. To implement the data storage capabilities of a memory cell 30, an electrical charge is placed on the drain 36 of the JFET 32 via a data or sense line, for example a bit line (BL). By controlling the voltage at the gate 40 via word line (WL), the depletion region between the gate 40 and the channel may be narrowed such that the electrical charge at the drain 36 can flow to the capacitor 34. By storing electrical charge in the capacitor 34, the charge may be interpreted as a binary data value in the memory cell 30. For instance, for a single-bit storage device, a positive charge above a known threshold voltage stored in the capacitor 34 may be interpreted as binary "1." If the charge in the capacitor 34 is below the threshold value, a binary value of "0" is said to be stored in the memory cell 30. For reasons discussed above, it will be appreciated that the voltage at the gate 40 may be limited to a voltage sufficiently below the diode turn-on voltage of the JFET's gate-channel junction.

The bit lines BL are used to read and write data to and from the memory cells 30. The word lines WL are used to activate the JFET 32 to access a particular row of a memory cell 30. Accordingly, the memory device 29 also includes a periphery portion which may include an address buffer 42, row decoder 44 and column decoder 46. The row decoder 44 and column decoder 46 selectively access the memory cells 30 in response to address signals that are provided on the address bus 48 during read, write and refresh operations. The address signals are typically provided by an external controller such as a microprocessor or another type of memory controller. The column decoder 46 may also include sense amplifiers and input/output circuitry to further facilitate the transmission of data to and from the memory cell 30 via the bit lines BL.

In one mode of operation, the memory device 29 receives the address of a particular memory cell 30 at the address buffer 42. The address buffer 42 identifies one of the word lines WL of the particular memory cell 30 corresponding to the requested address and passes the address to the row decoder 44. The row decoder 44 selectively activates the particular word line WL to activate the JFET's 32 of each memory cell 30 that is connected to the selected word line WL. The column decoder 46 selects the bit line (or bit lines) BL of the memory cell 30 corresponding to the requested address. For a write operation, data received by the input/output circuitry is coupled to the selected bit line (or bit lines) BL and provides for the charge or discharge of the capacitor 34 of the selected memory cell 30 through the JFET 32. The charge corresponds to binary data, as previously described. For a read operation, data stored in the selected memory cell 30, represented by the charge stored in the capacitor 34, is coupled to the select bit line (or bit lines) BL, amplified by the sense amplifier and a corresponding voltage level is provided to the input/output circuitry in the column decoder 46.

As described below, a memory device 29 that uses improved JFETs in accordance with certain disclosed embodiments may exhibit superior performance compared to prior art memory devices. For example, memory device 29 may exhibit increased performance due to the increased switching speed of the improved JFETs 32. Furthermore, because the JFET 32 may be activated by a lower gate voltage compared to typical MOSFET based memory devices, the charge stored on capacitor 34 may also be reduced, which may reduce leakage current of the capacitor 34.

In addition to the memory device 29, improved JFETs may also be used in other parts of the system 10. For example, JFETs fabricated in accordance with the techniques described herein may be used in the processor(s) 12, or any other component of the system 10 that uses integrated circuit logic devices. Referring to FIGS. 3-5, various embodiments of integrated circuit logic devices that include improved JFETs are depicted. Turning first to FIG. 3, an embodiment of a JFET inverter 50 is shown. The JFET inverter 50 includes a p-type JFET 52 and an n-type JFET 32 coupled in series between a high voltage terminal 54 and a low voltage terminal 56. It will be appreciated by a person of ordinary skill in the art that the output terminal 58 will be electrically coupled to the high voltage terminal 54 when the input terminal 60 is low and will be electrically coupled to the low voltage terminal 56 when the input terminal 60 is high.

A JFET NAND gate 64 is illustrated in FIG. 4 and includes two p-type JFETs 52 and two n-type JFETs 32 coupled between a high voltage terminal 54 and a low voltage terminal 56 as shown. The output terminal 66 electrically couples to the high voltage terminal 54 when either of input terminal 68 or 70 is low and electrically couples to the low voltage terminal 56 when both input terminals 68 and 70 are high.

A JFET NOR gate 72 is shown in FIG. 5 and includes two p-type JFETs 52 and two n-type JFETs 32 coupled between a high voltage terminal 54 and a low voltage terminal 56 as shown. An output terminal 74 of the JFET NOR gate 72 electrically couples to the high voltage terminal 54 when both input terminals 76 and 78 are low and the output terminal 74 electrically couples to the low voltage terminal 56 when either of input terminals 76 or 78 is high.

With regard to the logic devices 50, 64, and 72 discussed above, the voltage level applied to the gates 40 and 62 of the JFETs 32 and 52 may be kept below the diode turn-on voltage of the gate-channel junction to avoid excessive gate-to-drain current and the resulting power dissipation. To increase the voltage that may be applied to the JFET gates 40 and 62 without causing gate-to-drain current, the JFETs 32 and 52 may be fabricated in accordance with one or more embodiments that will be discussed below. It will be appreciated that the integrated circuit logic devices depicted in FIGS. 3-5 are examples only and many other JFET logic devices are possible utilizing improved JFET structures and techniques disclosed herein.

Figure 6:
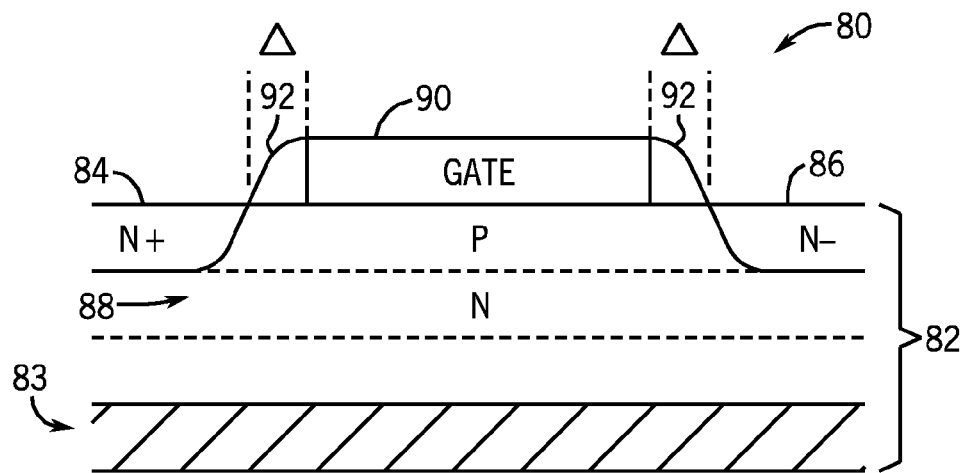
FIGS. 6-8 are cross-sectional views of JFETs in accordance with one or more embodiments of the present invention.

Referring to FIG. 6, a cross-sectional view of an enhancement mode n-JFET 80 is illustrated in accordance with an embodiment of the present invention. Enhancement mode n-JFETs typically have a threshold voltage greater than zero volts, whereas depletion mode transistors have a threshold voltage less than or equal to zero volts. It should be understood that although the following description is directed to an n-JFET structure, a p-JFET structure may be created without departing from the scope of the present invention. The enhancement mode n-JFET 80 may be a silicon-on-insulator (SOI) or silicon-on-sapphire (SOS) structure, for example. In such structures, a thin silicon film, semiconductor 82, is located on a surface of an insulator 83. As illustrated, a source region 84 and a drain region 86 may be formed in the semiconductor 82. The source region 84 and drain region 86 may be doped to form n+ regions, as illustrated. A channel region 88 may be formed in the semiconductor 82 in between the source and drain regions 84 and 86. The channel 88 may be doped in accordance with known techniques to form an n-type channel with a p+ gate interface, as shown. The channel 88 doping level is kept low, i.e., less than $1e^{16}/cm^3$. A gate 90 is formed over the channel region 88. The gate 90 may be formed in accordance with known techniques and may include materials known and commonly used in the art for gate structures.

Conventional JFET structures provide source and drain regions that extend inside the edges of the gate 90 so that portions of the gate 90 are formed directly on the source and drain regions 84 and 86. However, in accordance with this embodiment, the source and drain regions 84 and 86 do not extend under the gate 90. Rather, the source and drain regions 84 and 86 are removed a distance $\Delta$ from the edges of the gate 90. Additionally, spacers 92 are provided on each side of the gate 90. The spacers 92 may have a width commensurate with the distance $\Delta$. Specifically, for example, the spacers 92 may have a width/thickness in the range of 100 Å to 300 Å for a typical gate length of 0.1μ device. As such, the width/thickness may be approximately ⅓ the gate length. Additionally, the spacers 92 may be approximately ⅓ the length of the gate 90. The spacers 92 and the distance $\Delta$ between the source and drain regions 84 and 86 and the gate 90, off-sets the turn-on voltage of the transistor and effectively increases the turn-on voltage. Thus, the transistor 80 may be able to provide a higher operating current which correlates with a higher operating speed.

Figure 7:
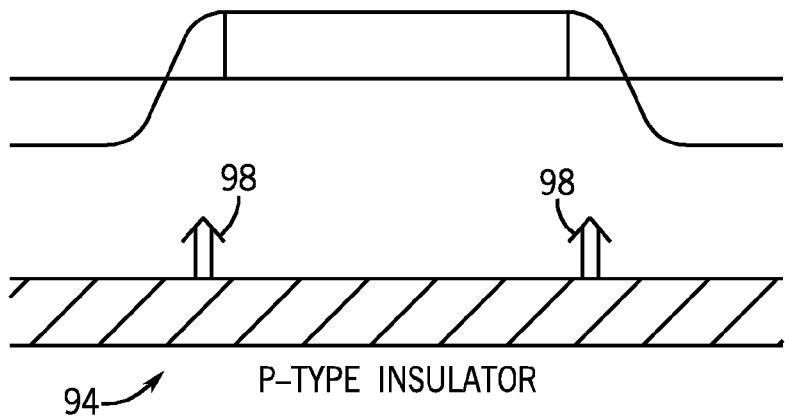
Figure 8:
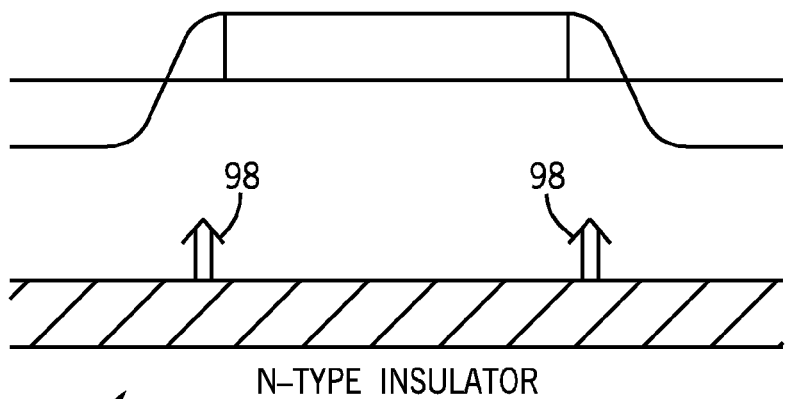
Figure 9:
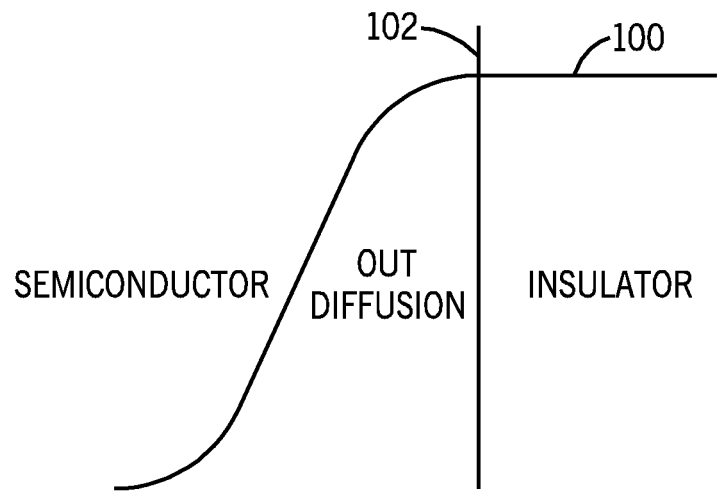
FIG. 9 illustrates out diffusion of ions from an insulator to a semiconductor in accordance with embodiments of the present invention.

In addition to providing the offset distance $\Delta$ and the spacers 90, an ion—rich oxide underneath the channel region 88 may be created. This may be created by doping the insulator 83 with ions. For example, FIGS. 7 and 8 illustrate p-type and n-type doped insulators, respectively. Referring first to FIG. 7, an insulator may be doped with phosphorus and/or arsenic, for example, to form a p-type insulator 94. Alternatively, as illustrated in FIG. 8, an insulator may be doped with boron, for example, to form an n-type insulator 96. After the insulators 94 and 96 have been doped, subsequent processing steps that form the JFET structure over the insulator cause the dopants to out diffuse into the semiconductor. This is illustrated by the arrows 98 shown in FIGS. 7 and 8. Additionally, FIG. 9 graphically illustrates the out diffusion of the dopant ions into the semiconductor from the insulator. In FIG. 9, the concentration of the dopant is illustrated by line 100. Vertical line 102 illustrates the interface of the insulator and the semiconductor. As mentioned above, subsequent processing steps which include application of heat to the structure, cause the dopants to out diffuse into the semiconductor. As such, no additional processing steps are added to cause the out diffusion of the doped ions. The dopant concentration in the insulator may be between $1e^{18}/cm^3$-$5e^{18}/cm^3$, and the insulator may be doped by any appropriate means. In particular, the insulator may be doped using any conventional implantation and/or solid state diffusion technique before formation of the semiconductor structure on the insulator. This forms a shallow p-type or n-type region underneath the channel.

Figure 10:
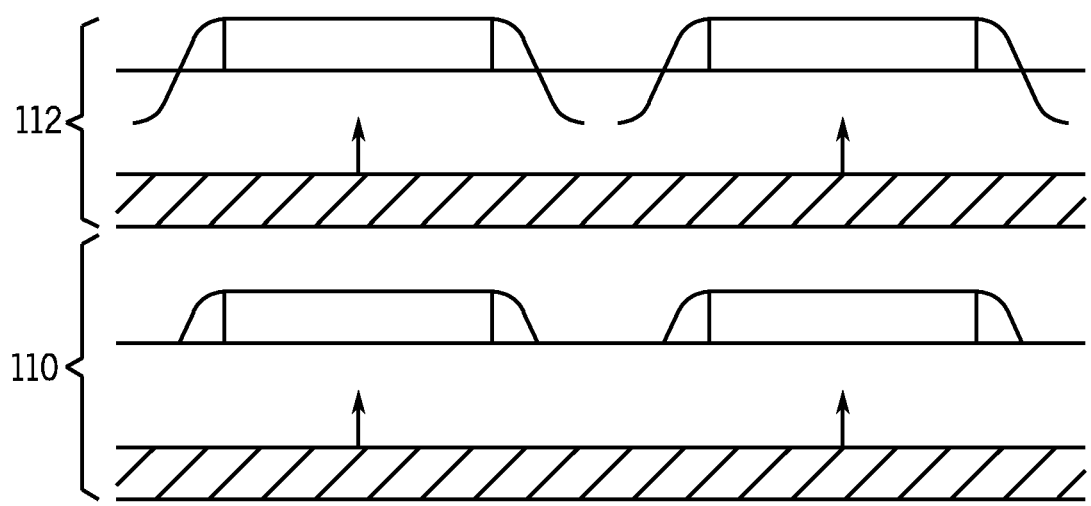
FIGS. 10-12 are cross-sectional views of multi-level JFET structures in accordance with embodiments of the present invention.

In another embodiment, the above-described structures may be layered one on top of the other, as illustrated in FIG. 10 to form a multi-level device. The stacking of levels allows for 3D integration of devices. For example, logic devices may be built in levels to provide additional density. Additionally, as will be discussed in greater detail below, memory, such as static random access memory (SRAM), may be added in additional levels or integrated within a level to provide embedded technology with logic in close proximity with memory. Additionally, multi-core processing designs can be easily enabled in such a scheme.

As shown in FIG. 10, a first level 110 of JFET structures may be created in accordance with the above-mentioned techniques and a second level 112 may be formed on top of the first level 110. The JFET structures of the first level 110 may include n-type JFETs and the second level 112 may include p-type JFETs, other configurations are also contemplated, for example. Transistors from each of the levels 110 and 112 may be electrically coupled to form logic devices such as those discussed above. Specifically, n-type and p-type transistors in different layers may be coupled together to form complementary logic. Although only two levels are illustrated in FIG. 10, it should be understood that more than two levels may be stacked together.

Figure 11:
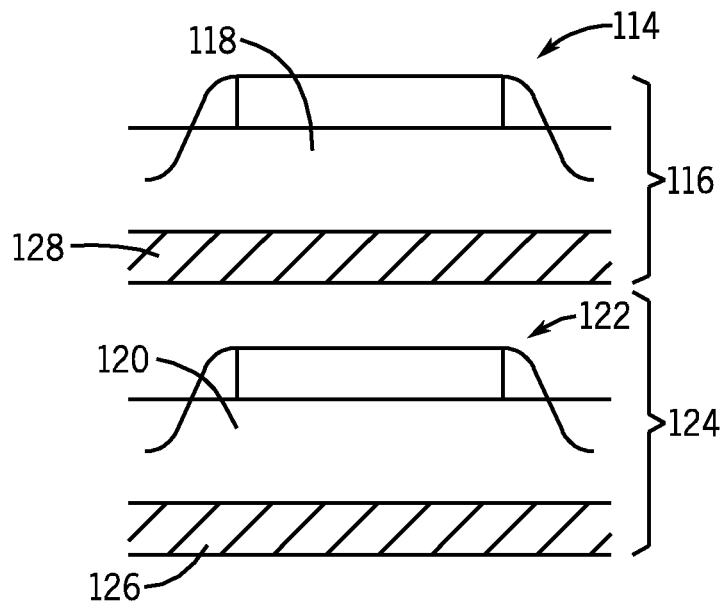

In other embodiments, the stacking of levels may include decreasing the size of a channel and/or decreasing the level of dopant in the insulative level of higher levels. That is, a level stacked on top of another level may have a relatively shorter channel and gate region. Additionally, an insulative layer of the level stacked on top of another level may be doped with less dopant than an insulative layer of an underlying level. FIG. 11 illustrates a JFET structure 114 of a second level 116 having a shorter channel 118 than a channel 120 of a corresponding JFET structure 122 of a first level 124. The channel 118 of the second level 116 may be between 30-40% shorter than the channel 120 of the first level 124. For example, if the channel 120 were approximately 0.20 to 0.30 microns, the channel 118 maybe approximately 0.05 to 0.15 microns long. The longer channel 120 in the first level 124 allows it to sustain a higher thermal strain, as it will experience all of the heating and cooling steps associated with the formation of subsequent levels.

Additionally, a doped insulator 126 of the first level 124 may have a higher dopant concentration than the insulator 128 of the second level 116. The higher concentration in the first level 124 may be correlated with the number of levels that will be subsequently stacked upon it. This is again related to the thermal budget, i.e., how much heat the transistor can withstand. The additional heat exposure to the higher concentration of dopant helps to activate the dopant. Specifically, there are at least two possibilities for the implanted dopants as they out-diffuse from the insulator into the silicon. First, the dopants, such as boron, for example, may enter into the lattice structure of the silicon formed on the insulator. This is commonly referred to as the dopant being interstitially located in the silicon lattice. Alternatively, the dopant may replace, or substitute, silicon that forms the lattice structure. This is commonly referred to as dopants being substitutionally located in the silicon lattice. The dopants are only activated when they are substitutionally located in the lattice. Generally, heat steps are required in order to achieve substitutional location of the dopants. Because the first level has a higher concentration, being exposed to the additional heat steps associated with the processing of additional stacked levels may help to fully activate the dopants diffusing out from the insulator into the silicon lattice, i.e, help them to substitutionally diffuse into the lattice.

Figure 12:
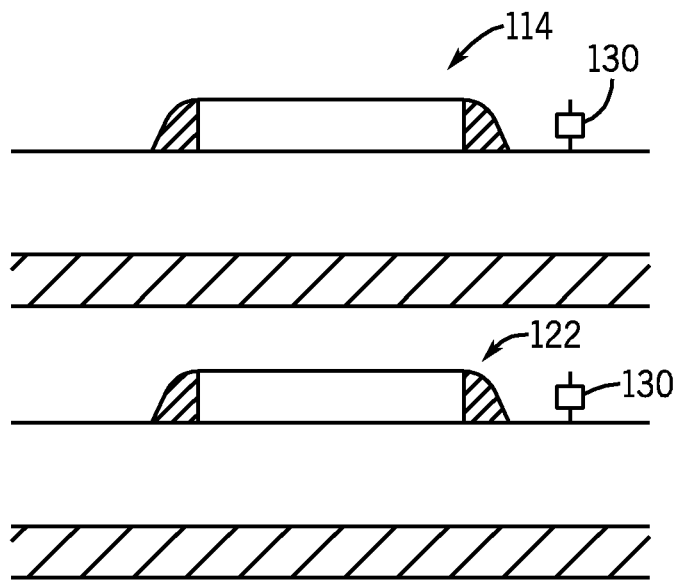

The JFET structures disclosed herein may be implemented as access devices in memory. As illustrated in FIG. 12 the stacked JFET structures 114 and 122 may be coupled to memory elements 130. The memory elements 130 may be any appropriate memory element such as, for example, phase change, capacitor, and/or spin-torque technology (STT) device. The use of the stacked JFET structure in a memory device may not only increase the density of the memory device, as stacking the memory cells increases density, but may also advantageously decrease power consumption when compared with commonly used MOS transistors. Furthermore, multiple levels may be used as embedded logic in the same multi-level stack as the memory cells, thus providing embedded technology with the logic in close proximity to the memory. Furthermore, multi-core processing designs may be easily enabled in such a scheme.

Figure 13:
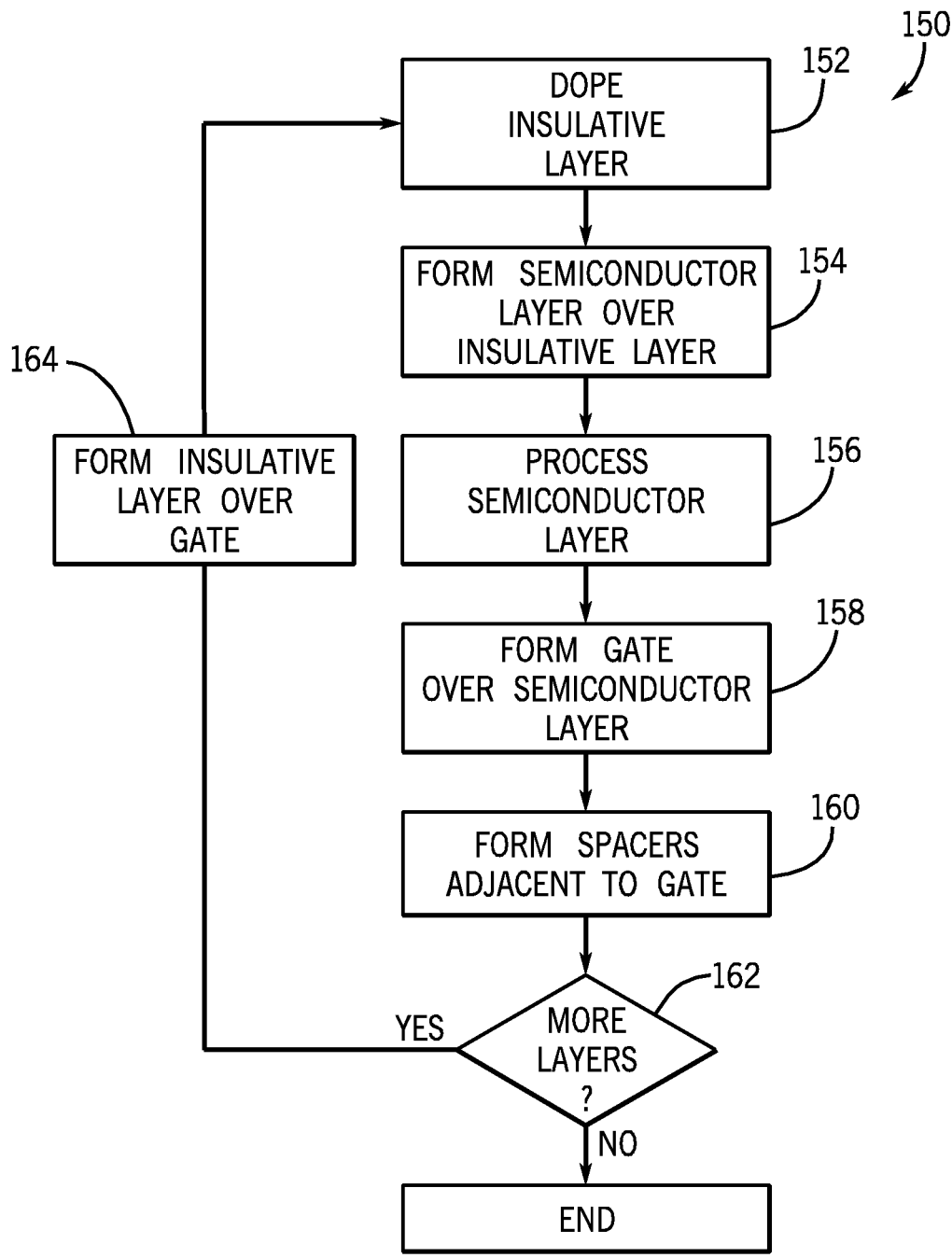
FIG. 13 is a flow chart depicting processes for fabricating JFETs in accordance with one or more embodiments of the present invention.

Referring to FIG. 13, a flow chart illustrates the process 150 of fabricating transistors in accordance with the present Invention. The process 150 begins by doping an insulative layer, as indicated at block 152. As discussed above, the insulative layer may be doped with boron, phosphorus or arsenic to provide either n-type or p-type doping of the insulative material. The concentration of the dopant can vary depending on the number of levels of transistors that will be stacked on top of a base level.

Next, a semiconductor material is formed over the insulator, as indicated at block 154. The semiconductor layer is processed to form an active area and isolation areas in the semiconductor and to form n-doped and/or p-doped wells, as indicated at block 156. Specifically, conventional lithography, oxidation and dopant implantation techniques form the active area and isolation areas. Additionally, through known techniques, the n-doped and/or p-doped wells are formed to create either n-type or p-type JFETs. The processing steps include multiple heating and cooling steps that cause out diffusion of the dopant from the insulator layer into the semiconductor.

At block 158, a gate is formed over the semiconductor using known techniques, and spacers are formed adjacent to the gate, as indicated at block 160. As discussed above, the gate is not formed over the source and drain regions of the semiconductor. Rather, the source and drain regions are displaced from the gate. This distance may be commensurate with the width of the spacers located adjacent to the gate. The spacer may be approximately ⅓ the length of the gate, as discussed above.

If additional levels are to be formed (block 162), the process continues by providing an insulative layer over the previous level, as indicated at block 164, and then repeats process 150. As described above, the stacked level may have different channel lengths from other levels and may also have different dopant concentrations in the respective insulative layers. Specifically, upper levels may have a shorter channel length and their insulative layers may have less dopant.

Additionally, different levels may be doped with different ionic charges from other levels. For example, an upper level may be doped to provide n-type transistors, while a lower level is doped to provide p-type transistors. Moreover, the levels may be electrically coupled to form logic devices and the transistors may be used as access device for memory cells, as described above.

While JFET structures, generally, provide the advantage of low power consumption, as noted above, conventionally, they have had limited applicability due to low forward bias turn-on voltages limiting them to low voltage operation and, thus, low drive current capability. In accordance with the embodiments disclosed herein, however, JFET structures have been presented that overcome the limitations of conventional JFET structures without compromises to short channel effects.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of fabricating a transistor comprising:
   doping an insulator;
   forming a semiconductor substrate over the doped insulator;
   doping regions of the semiconductor substrate to create a source region, a drain region and a channel region, wherein the channel region comprises a first doped region, a second doped region, and a third doped region, the first, second, and third doped regions together having an npn or a pnp configuration;
   forming a gate over the channel region; and
   forming spacers adjacent to the gate, wherein the source and drain regions of the semiconductor are separated from the gate a distance commensurate with the width of the spacers.

2. The method of claim 1, wherein the spacers are approximately ⅓ the length of the gate.

3. The method of claim 2 comprising doping the insulator with boron ions.

4. The method of claim 2 comprising doping the insulator with arsenic ions.

5. The method of claim 2 comprising doping the insulator with phosphorus ions.

6. A method of fabricating multi-level transistors wherein each level comprises:
   doping an insulator;
   forming a semiconductor substrate over the doped insulator;
   doping regions of the semiconductor substrate to create a source region, a drain region and a channel region, wherein the channel region comprises a first doped region, a second doped region, and a third doped region, the first, second, and third doped regions together having an npn or a pnp configuration;
   forming a gate over the channel region; and
   forming spacers adjacent to the gate, wherein the source and drain regions of the semiconductor are separated from the gate a distance commensurate with the width of the spacers.

7. The method of claim 6, wherein a channel region of transistors in an upper level is shorter than a channel region of transistors in a lower level.

8. The method of claim 6, wherein an insulator of an upper level has a lower dopant concentration than an insulator of a lower level.

9. The method of claim 6, wherein at least one level of the stacked levels comprises transistors coupled to memory elements.

10. The method of claim 6, wherein transistors are coupled together to form complementary logic devices.

* * * * *